United States Patent [19]
Hashimoto

[11] Patent Number: 4,866,544
[45] Date of Patent: Sep. 12, 1989

[54] DATA MODULATION AND DEMODULATION SYSTEM FOR MAGNETIC RECORDING SYSTEM

[75] Inventor: Shuichi Hashimoto, Kawasaki, Japan
[73] Assignee: Fujitsu Limited, Kawaski, Japan
[21] Appl. No.: 130,799
[22] Filed: Dec. 8, 1987
[30] Foreign Application Priority Data
Dec. 8, 1986 [JP] Japan .................... 61-292205
[51] Int. Cl.$^4$ .................................. G11B 5/09
[52] U.S. Cl. ............................ 360/40; 360/51
[58] Field of Search .................. 360/39, 40, 51; 340/347 D

[56] References Cited
U.S. PATENT DOCUMENTS

| | | | |
|---|---|---|---|
| 4,488,142 | 12/1984 | Franaszek . | |
| 4,672,362 | 6/1987 | Furukawa et al. | 360/40 |
| 4,675,652 | 6/1987 | Machado | 360/40 |
| 4,688,016 | 8/1987 | Fok | 360/40 |

*Primary Examiner*—Vincent P. Canney
*Attorney, Agent, or Firm*—Staas & Halsey

[57] ABSTRACT

A system for modulating and demodulating write data and read data in a magnetic recording system in accordance with a (1,7) RLL method. The modulating and demodulating system includes a first clock pulse generating circuit receiving a reference signal from a recording medium and generating a first clock pulse having a first frequency equal to a data write frequency in accordance with a phase of the reference signal; a second clock pulse generating circuit receiving the first clock pulse and generating a second clock pulse having a second frequency, the second frequency being two-thirds of the first frequency; and a unit for encoding data to be written in accordance with a (1,7) encoding and decoding other data to be read in accordance with a (1,7) decoding, in response to the first and second clock pulses.

13 Claims, 12 Drawing Sheets

Fig. 4a CLK$_{SYS}$

Fig. 4b SCK$_{BD}$

Fig. 4c P-LOAD

Fig. 5
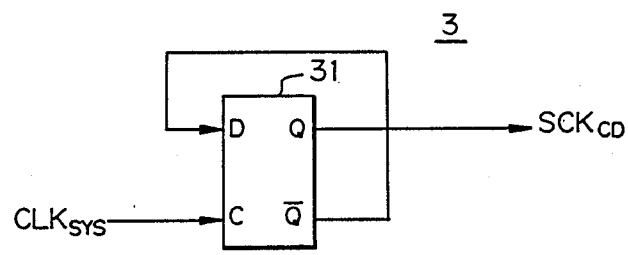
Fig. 10
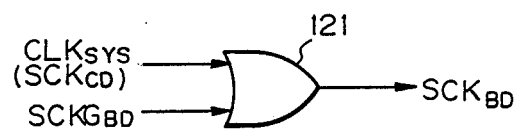

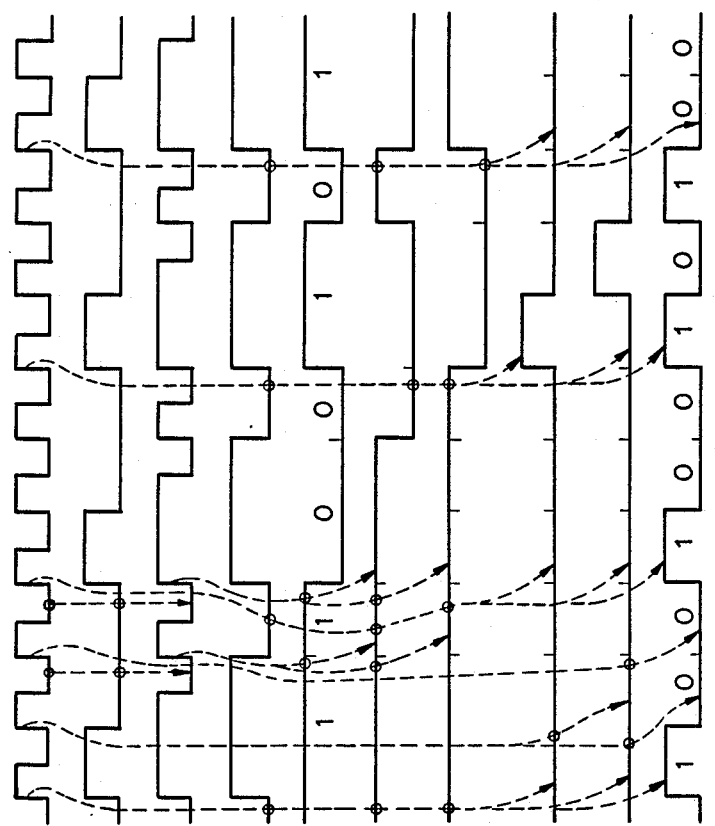

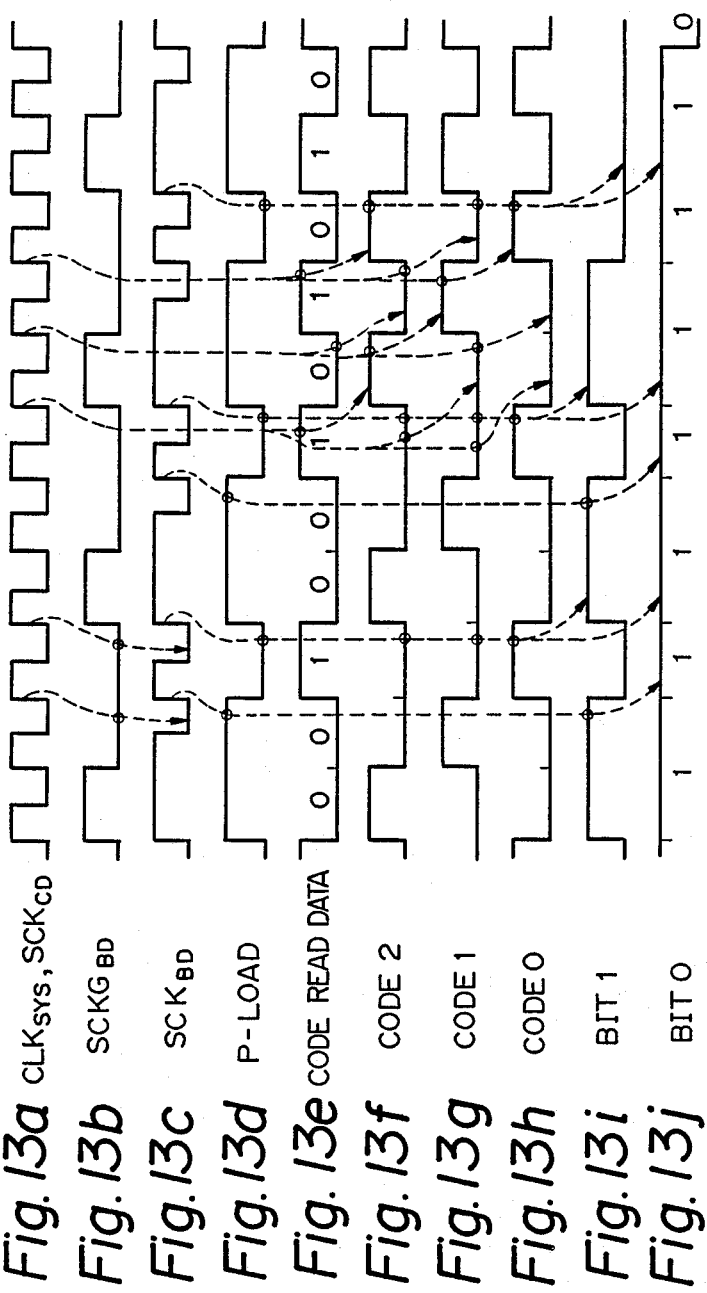

Fig. 14
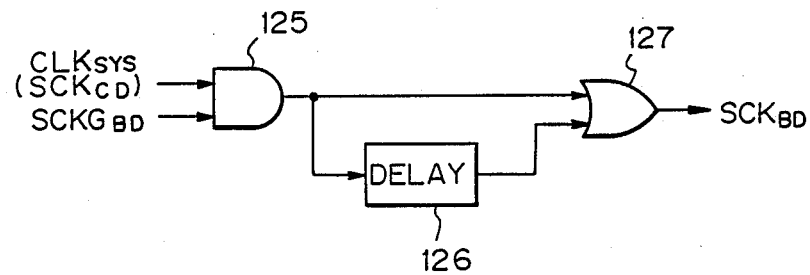
Fig. 15a CLKSYS (SCKCD)
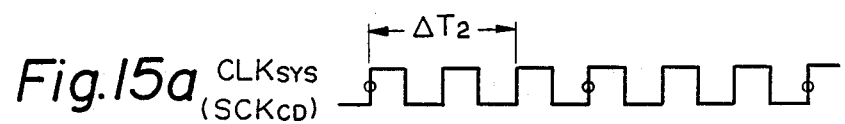
Fig. 15b SCKGBD
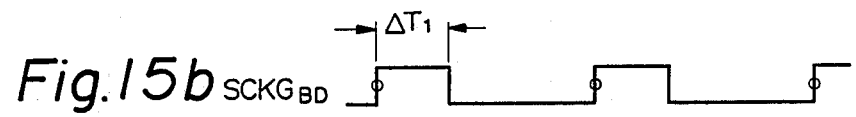
Fig. 15c SCKBD
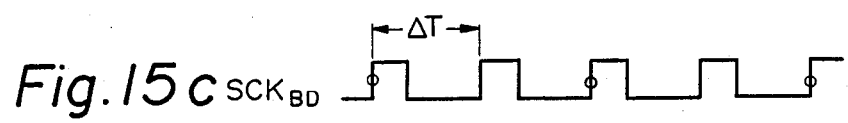

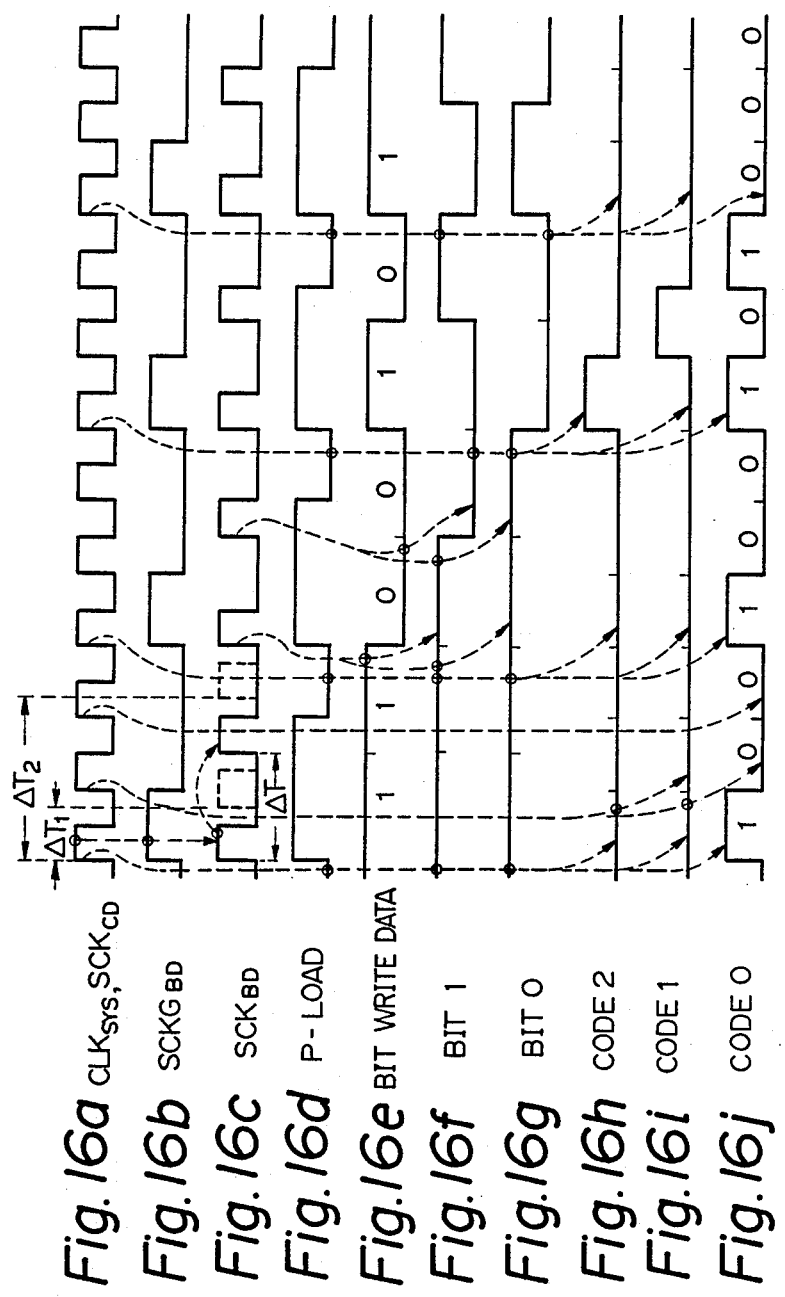

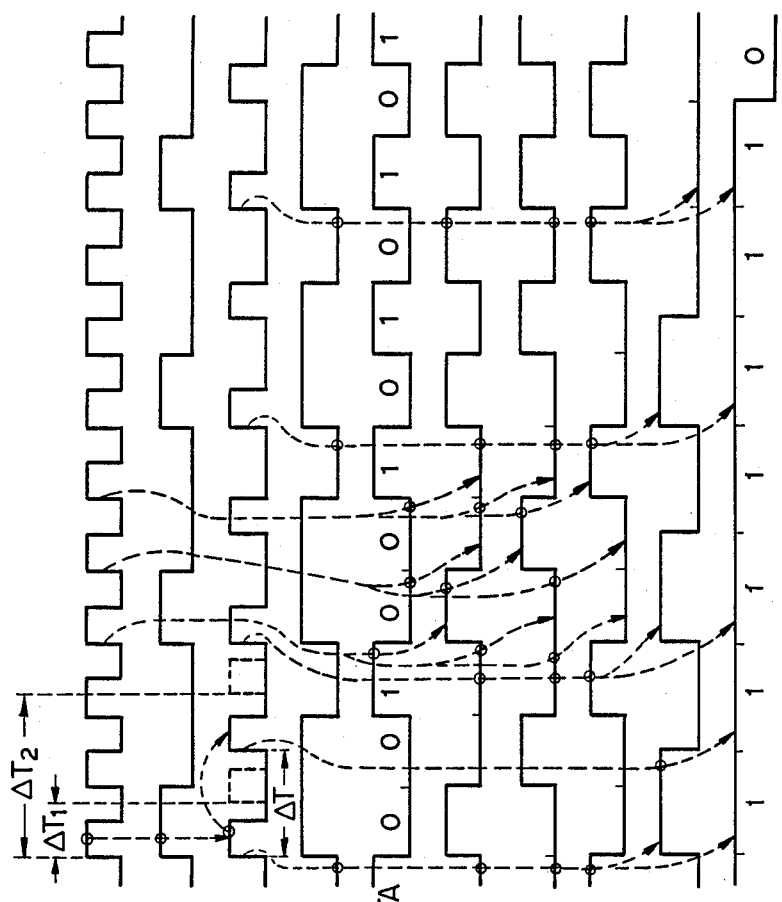

DATA MODULATION AND DEMODULATION SYSTEM FOR MAGNETIC RECORDING SYSTEM

BACKGROUND OF THE INVENTION

1. Field of the Invention

The present invention relates to a data modulation and demodulation system useful in a magnetic recording system. More particularly, it relates to a run length limited (RLL) type data modulation and demodulation system for a magnetic recording system.

In a magnetic recording system, such as a magnetic disc system, write data is modulated under synchronization with a system clock signal and the modulated data is stored in a magnetic disc. Conversely, the modulated and stored data is read and demodulated to restore original data used outside of the magnetic disc system. A data modulation and demodulation system is employed to achieve the above data encoding and decoding.

2. Description of the Related Art

A variety of modulation methods have been proposed for increasing the recorded density of data on magnetic media such as a magnetic disc. Recently, a modulation method, known as "variable length constant rate coding" and using a run length limited (RLL) format, has been applied to the magnetic recording system.

The variable length constant rate coding is carried out various ways, such as a coding of a (1,7) or 1/7 format with a rate of 2/3, hereinafter 1/7 coding, a coding of (2,7) or 2/7 format with a rate of 1/2, hereinafter 2/7 coding, and a coding of (1,8) or a 1/8 format. The 1/7 coding converts data with a rate of 2/3: two bits to three bits, and inserts a zero ("0"), up to seven zero bits, between consecutive one ("1") bits data. The 2/7 coding converts data with a rate of 1/2: one bit to two bits, and inserts at least two series zero ("0") bits, up to seven zero bits, between consecutive one ("1") bit data. Compared with the 1/7 coding and the 2/7 coding, the 1/7 coding does not require a high speed operable circuit and has a wide data detection window, but has a disadvantage of a low recording density. Conversely, the 2/7 coding achieves a high recording density, but requires a high speed operation circuit.

U.S. Pat. No. 4,488,142 discloses a (1,7) format for encoding and decoding with a rate of 2/3. The present invention also uses the (1,7) format encoding and decoding with a rate of 2/3, i.e., the 1/7 coding. However, U.S. Pat. No. 4,488,142 does not disclose a data modulation and demodulation system in which the 1/7 coding is applied.

SUMMARY OF THE INVENTION

An object of the present invention is to provide a data modulation and demodulation system to which a 1/7 coding is applied, and which is useful in a magnetic recording system.

Another object of the present invention is to provide a low speed operable data modulation and demodulation system to which a 1/7 coding is applied and which is useful in a magnetic recording system.

Still another object of the present invention is to provide a simple circuit construction for a data modulation and demodulation system to which a 1/7 coding is applied and which is useful in a magnetic recording system.

According to the present invention, there is provided a system for modulating and demodulating data written into and read from a magnetic recording medium in accordance with a (1,7) run length limited method, including: a first clock pulse generating circuit receiving a reference signal from the recording medium and generating a first clock pulse having a first frequency equal to a data write frequency in accordance with a phase of the reference signal; a second clock pulse generating circuit receiving the first clock pulse and generating a second clock pulse having a second frequency, the second frequency being two-thirds of the first frequency; and a unit for encoding data to be written in accordance with a (1,7) encoding, and decoding other data to be read in accordance with a (1,7) decoding, in response to the first and second clock pulses.

The first clock pulse generating circuit may comprise a phase-locked loop circuit.

The second clock pulse generating circuit may comprise a one-third frequency divider receiving the first clock pulse and a gate pulse having a one-third frequency that of the first frequency of the first clock pulse, and an OR gate receiving the first clock pulse and the gate pulse and outputting the second clock pulse.

The second clock pulse generating circuit may also comprise a one-third frequency divider receiving the first clock pulse and a gate pulse having a frequency one-third of that of the first frequency of the first clock pulse, an AND gate receiving the first clock pulse and the gate pulse, a delay circuit delaying a signal output from the AND gate by a time between a one cycle time and a one and half cycle time of the first clock pulse, and an OR gate receiving the signal output from the AND gate and a delayed signal from the delay circuit and outputting the second clock pulse.

The encoding and decoding unit may comprise a first shift register having two bits and receiving the second clock pulse and the write data, an encoding and decoding circuit operatively connected to the first shift register, and a second shift register, operatively connected to the encoding and decoding circuit, having three bits and receiving the first clock pulse and the read data. The encoding and decoding circuit receives the write data from the first shift register, encodes the write data in accordance with the (1,7) coding, and outputs the encoded data to the second shift register, when a data write operation is carried out. Or, the encoding and decoding circuit receives the read data from the second shift register, decodes the read data in accordance with the (1,7) decoding, and outputs the decoded data to the first shift register when a data read operation is carried out.

BRIEF DESCRIPTION OF THE DRAWINGS

Other objects and features of the present invention will be described with reference to the accompanying drawings, in which:

FIGS. 4a to 4c are views of waveforms of signals in FIG. 3;

FIG. 5 is a circuit diagram of a ½ frequency divider shown in FIG. 1;

FIG. 10 is a circuit diagram of a first example of a two pulse generator shown in FIG. 9;

FIGS. 11a to 11c are views of waveforms of signals in FIG. 10;

FIGS. 12a to 12j are timing charts illustrating the write operation of the system shown in FIG. 9 when the circuit shown in FIG. 10 is applied thereto;

FIGS. 13a to 13j are timing charts illustrating the read operation of the system shown in FIG. 9 when the circuit shown in FIG. 10 is applied thereto;

FIG. 14 is a circuit diagram of a second example of the two pulse generator shown in FIG. 9;

FIGS. 15a to 15c are views of waveforms of signals in FIG. 14;

FIGS. 16a to 16j are timing charts illustrating the write operation of the system shown in FIG. 9 when the circuit shown in FIG. 14 is applied thereto; and FIGS. 17a to 17j are timing charts illustrating the read operation of the system shown in FIG. 9 when the circuit shown in FIG. 14 is applied thereto.

DESCRIPTION OF THE PREFERRED EMBODIMENTS

Figure 1:
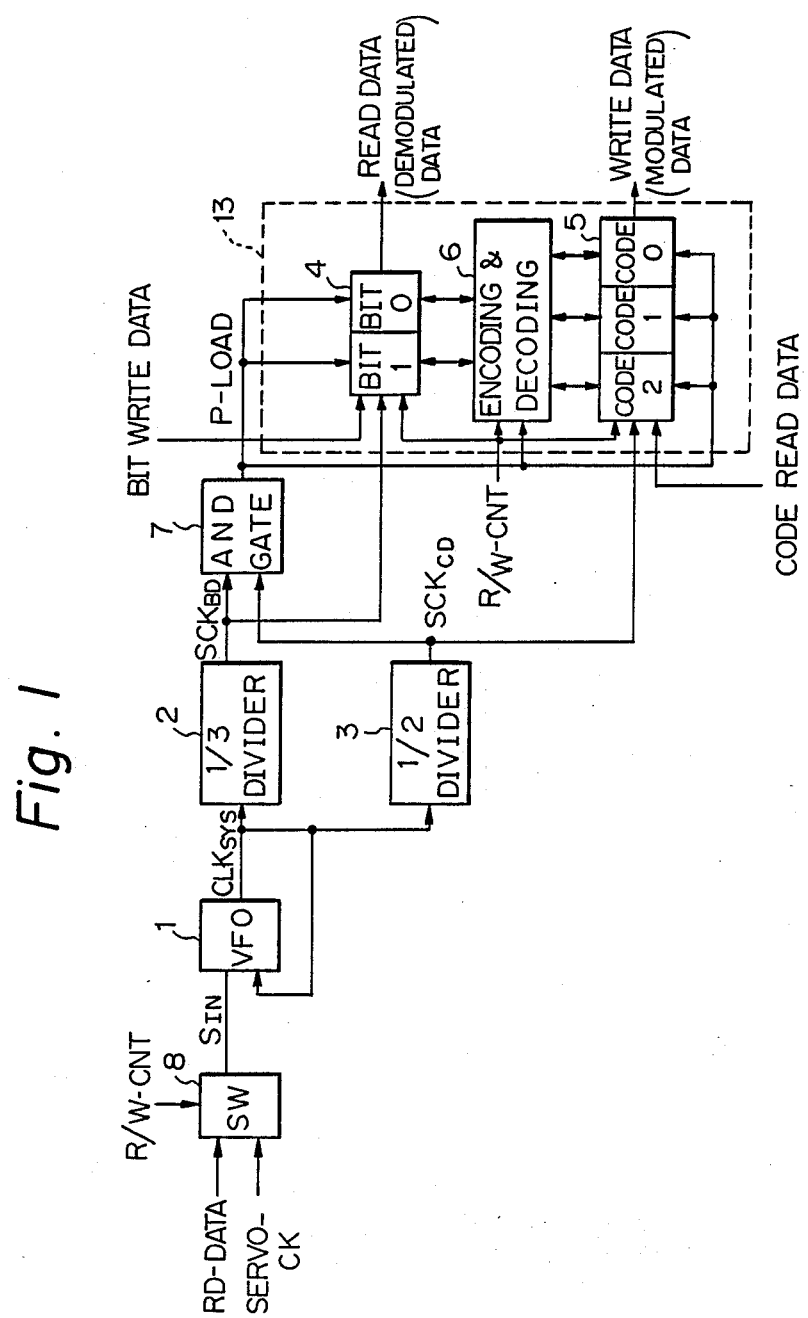
FIG. 1 is a circuit diagram of a first embodiment of a data modulation and demodulation system in accordance with the present invention.

Referring to FIG. 1, a first embodiment of a data modulation and demodulation system applied to a magnetic disc system will be described.

In FIG. 1, the data modulation and demodulation system includes a switch 8, a variable frequency oscillator (VFO) 1, a ⅓ frequency divider 2, a half (½) frequency divider 3, an AND gate 7, a bit register 4, a code register 5, and an encoding and decoding circuit 6. Since a data read is carried out under the 1/7 decoding, the bit register 4 has two bits. On the other hand, as a data write is carried out under the 1/7 encoding, the code register 5 has three bits. The encoding and decoding circuit 6 is used for the 1/7 encoding and the 1/7 decoding. The ⅓ frequency divider 2 and the ½ frequency divider 3 are used for a two bit to three bit conversion (encoding) when a data read operation is carried out, and a three bit to two bit conversion (decoding) when a data write operation is carried out.

Figure 2:
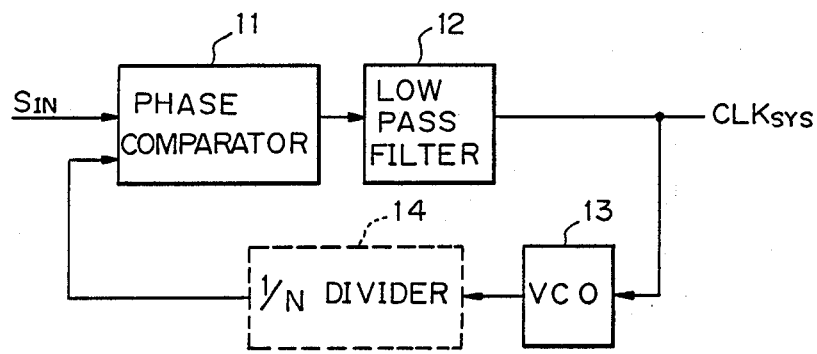
FIG. 2 is a circuit diagram of a variable frequency oscillator shown in FIG. 1.

The switch 8 receives read data RD-DATA and a servo clock SERVO-CK and outputs the read data RD-DATA to the VFO 1 when the data read operation is carried out, or outputs the servo clock or reference signal SERVO-CK when a data write operation is carried out. The VFO 1 receives the read data RD-DATA or the servo clock SERVO-CK as an input signal $S_{IN}$ and outputs a system clock $CLK_{SYS}$ having a stable reference frequency. The VFO 1 is realized by a phase-locked loop (PLL) circuit as shown in FIG. 2. The VFO 1 includes a phase comparator 11, a low pass filter 12, and a voltage controlled oscillator (VCO) 13. The VFO 1 also may include a 1/N frequency divider 14. The VFO 1 generates the system clock $CLK_{SYS}$ on the basis of the phase of the input signal $S_{IN}$.

Figure 3:
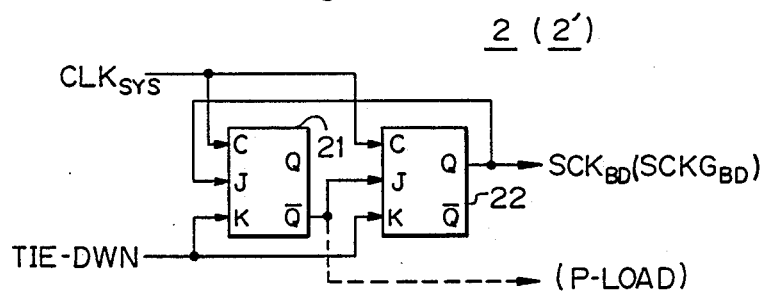
FIG. 3 is a circuit diagram of a ⅓ frequency divider shown in FIG. 1.

FIG. 3 shows a circuit diagram of the ⅓ frequency divider 2. The ⅓ frequency divider 2 includes two J-K flip-flops (J-K FFs) 21 and 22. The ⅓ frequency divider 2 outputs a bit data shift clock $SCK_{BD}$, as shown in FIG. 4b, having a frequency that is one-third of the frequency of the system clock $CLK_{SYS}$ as shown in FIG. 4a. FIG. 5 shows a circuit diagram of the ½ frequency divider 3. The ½ frequency divider 3 includes a D-FF 31. The ½ frequency divider 3 outputs a code data shift clock $SCK_{CD}$ having a frequency that is a half of that of the system clock $CLK_{SYS}$. The AND gate 7 receives the bit data shift clock $SCK_{BD}$ from the ⅓ frequency divider 2 and the code data shift clock $SCK_{CD}$ from the ½ frequency divider 3 and outputs a parallel load signal P-LOAD as shown in FIG. 4c.

Figure 6:
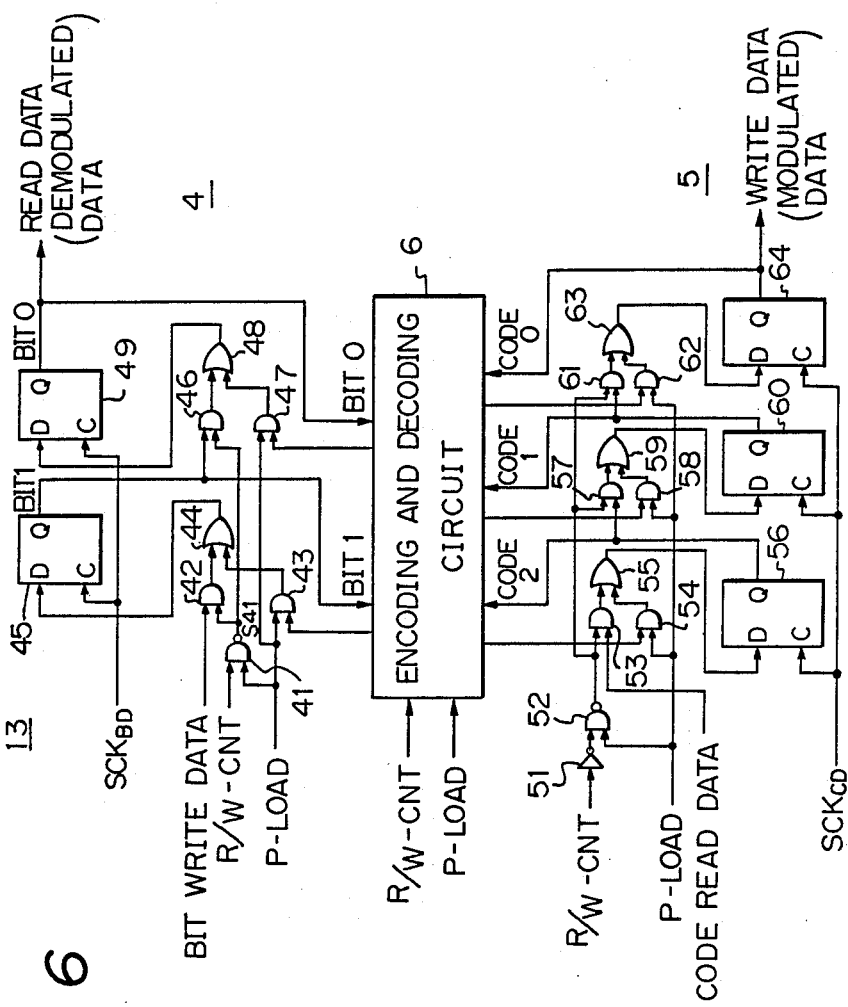
FIG. 6 is a circuit diagram of an encoding and decoding unit shown in FIG. 1.

FIG. 6 shows a circuit diagram of an encoding and decoding unit 13 shown in FIG. 1 and consisting of the bit register 4, the code register 5, and the encoding and decoding circuit 6.

The bit register 4 includes a NAND gate 41 receiving a read and write control signal R/W-CNT and the parallel load signal P-LOAD and outputting a mode signal S41 indicating a read mode or a write mode in response to the read and write control signal R/W-CNT. In the preferred embodiment, the read and write control signal R/W-CNT is a logical one "1" when a read operation is carried out, but otherwise is a logical zero "0". The bit register 4 also includes a BIT1 circuit having AND gates 42 and 43, an OR gate 44, and a D-FF 45, and a BIT0 circuit having AND gates 46 and 47, an OR gate 48, and a D-FF 49. The bit data shift clock $SCK_{BD}$ from the ⅓ frequency divider is supplied to clock terminals C of the D-FF's 45 and 49. A BIT WRITE DATA signal is supplied to a terminal of the AND gate 42 and, to the D-FF 45 through the OR gate 44, and a positive (Q) output of the D-FF 45 is supplied to the AND gate 46 and via the OR gate 48 to the D-FF 49. Decoded bit data, which will be described later, can be supplied to the AND gates 43 and 47. Q outputs from the D-FF's 45 and 49 can also be supplied to the encoding and decoding circuit 6. Since the bit register 4 is used for both encoding and decoding, the decoded bit data is read when a data read operation is carried out, and the Q outputs are supplied when a data write operation is carried out. The bit register 4 operates in response to the parallel load signal P-LOAD from the AND gate 7.

The code register 5 includes an inverter 51 and a NAND gate 52. These circuits correspond to the NAND gate 41 and function as a mode selector, except that a polarity of an output therefrom is an inversion of that of the NAND gate 41. The code register 5 also includes a CODE2 circuit having AND gates 53 and 54, an OR gate 55, and a D-FF 56, a CODE1 circuit having AND gates 57 and 58, an OR gate 59, and a D-FF 60, and a CODE0 circuit having AND gates 61 and 62, an OR gate 63, and a D-FF 64. The code data shift clock $SCK_{CD}$ from the ½ frequency divider 3 is supplied to clock terminals C the D-FF's 56, 60, and 64. A CODE READ DATA signal is supplied to the D-FF's 56, 60, and 64 through the gates 53 and 55, the gates 57 and 59, and the gates 61 and 63, respectively. Similar to the bit register 4, the code register 5 is also used for both encoding and decoding, and thus encoded bit data from the encoding and decoding circuit 6 can be supplied to the AND gates 54, 58 and 62, and Q outputs of the D-FF's 56, 60 and 64 also can be supplied to the encoding and decoding circuit 6.

Figure 7:
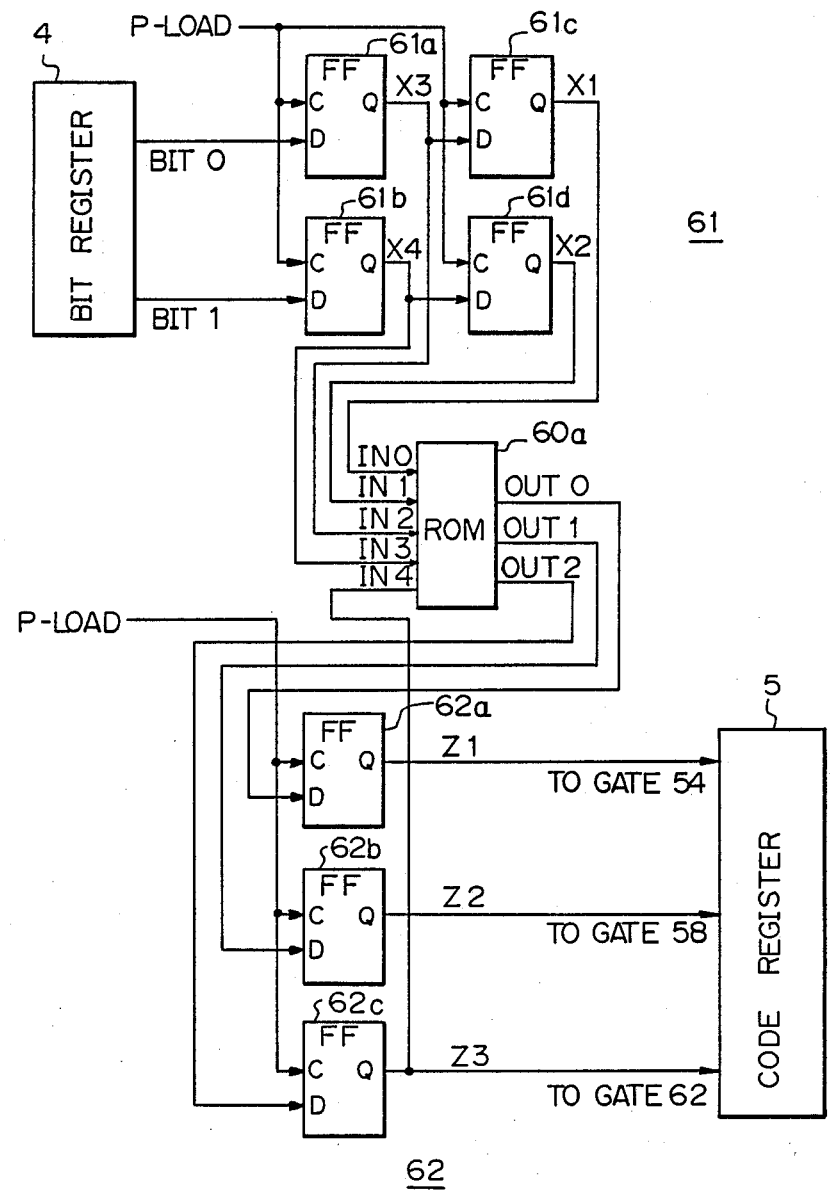
FIG. 7 is a circuit diagram of an encoding and decoding circuit shown in FIG. 6 when that circuit is operated as an encoder.
Figure 8:
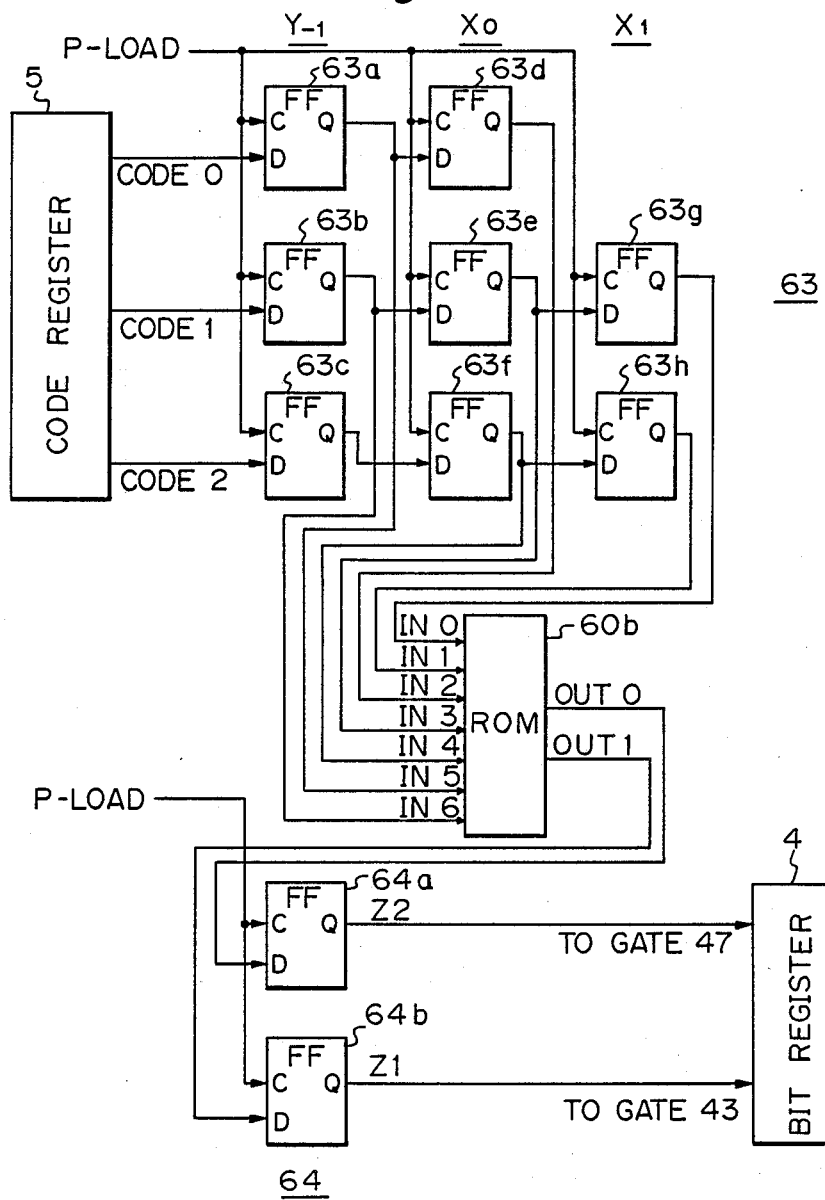
FIG. 8 is a circuit diagram of the encoding and decoding circuit shown in FIG. 6 when that circuit is operated as a decoder.

FIG. 7 shows a circuit diagram of the encoding and decoding circuit 6 when operated as a 1/7 encoder upon receipt of the read and write control signal R/W-CNT of "0", indicating a data write operation, and FIG. 8 shows a circuit diagram of the encoding and decoding circuit 6 when operated as a 1/7 decoder.

In FIG. 7, the encoding and decoding circuit 6 includes an encoding address generation circuit 61 having D-FF's 61a to 61d, a read-only-memory (ROM) 60a, and an encoded output circuit 62 having D-FF's 62a to 62c. The 1/7 coding is shown in Table 1 as an example.

TABLE 1

| DATA | CODE |
|---|---|
| 01 | X00 |
| 10 | 010 |
| 11 | X01 |
| 0001 | X00001 |
| 0010 | X00000 |
| 0011 | 010001 |
| 0000 | 010000 | where X denotes a bit complementary to a preceding bit.

Data is supplied from the bit register 4 as BIT0 and BIT1. Another 1/7 coding can be carried out as shown in the Table 2 disclosed in U.S. Pat. No. 4,488,142, and is known as an "Encoder State Dependent Table".

TABLE 2

| Current Data Word | | Next Data Word | | CODE | | |
|---|---|---|---|---|---|---|
| X1 | X2 | X3 | X4 | Z1 | Z2 | Z3 |
| 1 | 0 | 0 | * | 1 | 0 | 1 |
| 1 | 0 | 1 | * | 0 | 1 | 0 |
| 1 | 1 | 0 | 0 | 0 | 1 | 0 |
| 1 | 1 | 0 | 0 | 1 | 0 | 0 |
| 0 | 0 | 0 | * | 0 | 0 | 1 |
| 0 | 0 | 1 | * | 0 | 0 | 0 |
| 0 | 1 | 0 | * | 0 | 0 | 1 |
| 0 | 1 | 1 | * | 0 | 0 | 0 |
| 0 | 0 | 0 | * | 0 | 0 | 1 |
| 0 | 0 | 1 | * | 0 | 1 | 0 |
| 0 | 1 | 0 | 0 | 0 | 1 | 0 |
| 0 | 1 | 0 | 0 | 0 | 0 | 0 | where, * denotes "don't care", and $\overline{00}$ means "not 00"

In Table 2, the portion above the dotted line indicates the coding when the last bit Z3 of a previous coded data is zero ("0"), e.g. "100", and the portion below the dotted line indicates the coding when the last bit Z3 is one ("1"), e.g. "101". Symbols X1 to X4 and Z1 to Z3 in FIG. 7 correspond to those in Table 2. To realize the above encoding, the ROM 60a stores a coding table as shown in Table 3. Note that Table 3 shows only a part of that coding table.

TABLE 3

| ADDRESS | | | | | DATA | | |
|---|---|---|---|---|---|---|---|
| IN0 | IN1 | IN2 | IN3 | IN4 | OUT0 | OUT1 | OUT2 |
| 0 | 0 | 0 | 0 | 0 | 0 | 0 | 1 |
| 1 | 0 | 0 | 0 | 0 | 1 | 0 | 1 |
| 0 | 1 | 0 | 0 | 0 | 0 | 0 | 1 |
| 1 | 1 | 0 | 0 | 0 | 0 | 1 | 0 |
| 0 | 0 | 1 | 0 | 0 | 0 | 0 | 0 |
| 1 | 0 | 1 | 0 | 0 | 0 | 1 | 0 |
| 0 | 1 | 1 | 0 | 0 | 0 | 0 | 0 |
| 1 | 1 | 1 | 0 | 0 | 0 | 1 | 0 |
| 0 | 0 | 0 | 1 | 0 | 0 | 0 | 1 |
| 1 | 0 | 0 | 1 | 0 | 1 | 0 | 1 |
| 0 | 1 | 0 | 1 | 0 | 0 | 0 | 1 |

TABLE 3-continued

| ADDRESS | | | | | DATA | | |
|---|---|---|---|---|---|---|---|
| IN0 | IN1 | IN2 | IN3 | IN4 | OUT0 | OUT1 | OUT2 |
| 1 | 1 | 0 | 1 | 0 | 1 | 0 | 0 |
| 0 | 0 | 1 | 1 | 0 | 0 | 0 | 0 |
| 1 | 0 | 1 | 1 | 0 | 0 | 1 | 0 |
| 0 | 1 | 1 | 1 | 0 | 0 | 0 | 0 |
| 1 | 1 | 1 | 1 | 0 | 1 | 0 | 0 |
| 0 | 0 | 0 | 0 | 1 | 0 | 0 | 1 |

In FIG. 8, the encoding and decoding circuit 6 includes a decoding address generation circuit 63 having D-FF's 63a to 63h, a ROM 60b, and a decoded output circuit 64 having D-FF's 64a and 64b. The encoding and decoding circuit 6 decodes data in accordance with the following Table 4, which is called a "Decoder State Dependent Table" in U.S. Pat. No. 4,488,142.

TABLE 4

| $Y_{-1}$ | $X_0$ | $X_1$ | Z2Z1 |
|---|---|---|---|
| X10 | 000 | XXX | 00 |
| X00 | 000 | XXX | 01 |
| XXX | 100 | XXX | 11 |
| XX0 | 010 | 00X | 10 |
| XX0 | 010 | 00X | 11* |
| XXX | 101 | XXX | 10 |
| X00 | 001 | XXX | 01 |
| X10 | 001 | XXX | 00 |
| XX1 | 001 | XXX | 00 |
| XX1 | 010 | 00X | 00 |
| XX1 | 010 | 00X | 01 |
| XX1 | 000 | XXX | 01 | where, $\overline{00}$ means "not 00", and X denotes "don't care".

Symbols $Y_{-1}$, $X_0$, $X_1$, Z2 and Z1 in Table 4 correspond to those in FIG. 8. To realize the above decoding, the ROM 60b stores a decoding table as shown in Table 5. Note, Table 5 shows only a part of that decoding table.

TABLE 5

| ADDRESS | | | | | | | DATA | |
|---|---|---|---|---|---|---|---|---|
| IN0 | IN1 | IN2 | IN3 | IN4 | IN5 | IN6 | OUT0 | OUT1 |
| 0 | 0 | 0 | 0 | 0 | 0 | 0 | 0 | 1 |
| 1 | 0 | 0 | 0 | 0 | 0 | 0 | 0 | 0 |
| 0 | 1 | 0 | 0 | 0 | 0 | 0 | 0 | 1 |
| 1 | 1 | 0 | 0 | 0 | 0 | 0 | 0 | 1 |
| 0 | 0 | 1 | 0 | 0 | 0 | 0 | 1 | 1 |
| 1 | 0 | 1 | 0 | 0 | 0 | 0 | 1 | 1 |
| 0 | 1 | 1 | 0 | 0 | 0 | 0 | 1 | 1 |
| 1 | 1 | 1 | 0 | 0 | 0 | 0 | 1 | 1 |
| 0 | 0 | 0 | 1 | 0 | 0 | 0 | 1 | 1 |
| 1 | 0 | 0 | 1 | 0 | 0 | 0 | 1 | 1 |
| 0 | 1 | 0 | 1 | 0 | 0 | 0 | 0 | 1 |
| 1 | 1 | 0 | 1 | 0 | 0 | 0 | 0 | 1 |

To simplify the description and enable an easy understanding thereof, the encoding and decoding circuit 6 is illustrated separately in FIGS. 7 and 8. In practice, the encoding and decoding circuit 6 is a combination of the circuits shown in FIGS. 7 and 8. The ROMs 60a and 60b are formed by a single ROM. To enable separate encoding and decoding, bi-directional busses are provided between the bit register 4 and the encoding and decoding circuit 6, and between the encoding and decoding circuit 6 and the code register 4. These busses are not shown in the Figures. Conversely, the encoding circuit shown in FIG. 7 and the decoding circuit shown in FIG. 8 can be provided independently.

Referring again to FIG. 1, in order to carry out two bit to three bit coding and a three bit to two bit decoding, the ½ frequency divider 3 provides the code data shift clock $SCK_{CD}$ used as a shift clock in the code register 5, i.e., a three bit shift register as shown in FIG. 6, and the ⅓ frequency divider 2 provides the bit data shift clock $SCK_{BD}$ used as a shift clock in the bit register 4, i.e., a two bit shift register as shown in FIG. 6. The code data shift clock $SCK_{CD}$ and the bit data shift clock $SCK_{BD}$ must be maintained in a fine synchronization state with a relationship of 2:3. To realize this condition, the system clock $CLK_{SYS}$ must have a frequency $f_{CLKSYS}$ of the least common multiple of a frequency $f_{SCKCD}$ of the code data shift clock $SCK_{CD}$ and a frequency $f_{SCKBD}$ of the bit data shift clock $SCK_{BD}$. Note, $f_{SCKCD}$ is defined by the speed of the data write operation, and $f_{SCKBD}$ is defined by the speed of the data read operation. When $f_{SCKCD}$ is 54 MHz and $f_{SCKBD}$ is 36 MHz, the frequency $f_{CLKSYS}$ of the system clock $CLK_{SYS}$ is 108 MHz. The VFO 1 generates a system clock $CLK_{SYS}$ of 108 MHz.

The data write operation will be described. The switch 8 outputs the servo clock SERVO-CK to the VFO 1, to generate the system clock $CLK_{SYS}$. The ⅓ frequency divider 2 outputs the bit data shift clock $SCK_{BD}$, and the ⅓ frequency divider 3 outputs the code data shift clock $SCK_{CD}$. The BIT WRITE DATA to be stored is supplied to the bit register 4 in synchronization with the system clock $CLK_{SYS}$. The data input into the bit register 4 is shifted by the bit data shift clock $SCK_{BD}$ and stored in the D-FF's 45 and 49 shown in FIG. 6 as BIT1 and BIT0. This BIT1 and BIT0 data is loaded into the encoding and decoding circuit 6 in response to the parallel load signal P-LOAD from the AND gate 7, as shown in FIG. 4c. The loaded BIT1 and BIT0 are encoded (modulated) into three bit data in accordance with the 1/7 coding set forth above, and the encoded three bit data is read from the encoding and decoding circuit 6 to the code register 5 in response to the read and write control signal R/W-CNT, and stored in the D-FF's 56, 60 and 64 in the code register 5 as CODE2, CODE1 and CODE0, in response to the code data shift clock $SCK_{CD}$. This three bit coded data is output as WRITE DATA to the magnetic disc. The output frequency of the WRITE DATA (or modulated data) from the code register 5 is 54 MHz.

The data read operation will now be described. The switch 8 outputs the read data RD-DATA to the VFO 1, generating the system clock $CLK_{SYS}$. CODE READ DATA, which is read out in synchronization with the system clock $CLK_{SYS}$, is supplied to the code register 5, and the data supplied to the code register 5 is stored in the D-FF's 56, 60 and 64 shown in FIG. 6 by the code data shift clock $SCK_{CD}$ from the ⅓ frequency divider 3. The CODE2 to CODE0 in the D-FF's 56, 60 and 64 are loaded into the encoding and decoding circuit 6 in response to the parallel load signal P-LOAD. The loaded three bit data is decoded (demodulated) into two bit data in accordance with the 1/7 decoding set forth above, and the decoded data is supplied to the bit register 4 in response to the read and write control signal R/W-CNT and stored in the D-FF's 45 and 49 in response to the bit data shift clock $SCK_{BD}$ from the ⅓ frequency divider 2. The output frequency of READ DATA (or modulated data) from the bit register 4 is 36 MHz.

In FIG. 1, the VFO 1 requires a source clock of 108 MHz when the read data frequency is 36 MHz and the write data frequency is 54 MHz. The realization of a VFO 1 operable over 100 MHz is difficult from the viewpoints of stability and cost.

Figure 9:
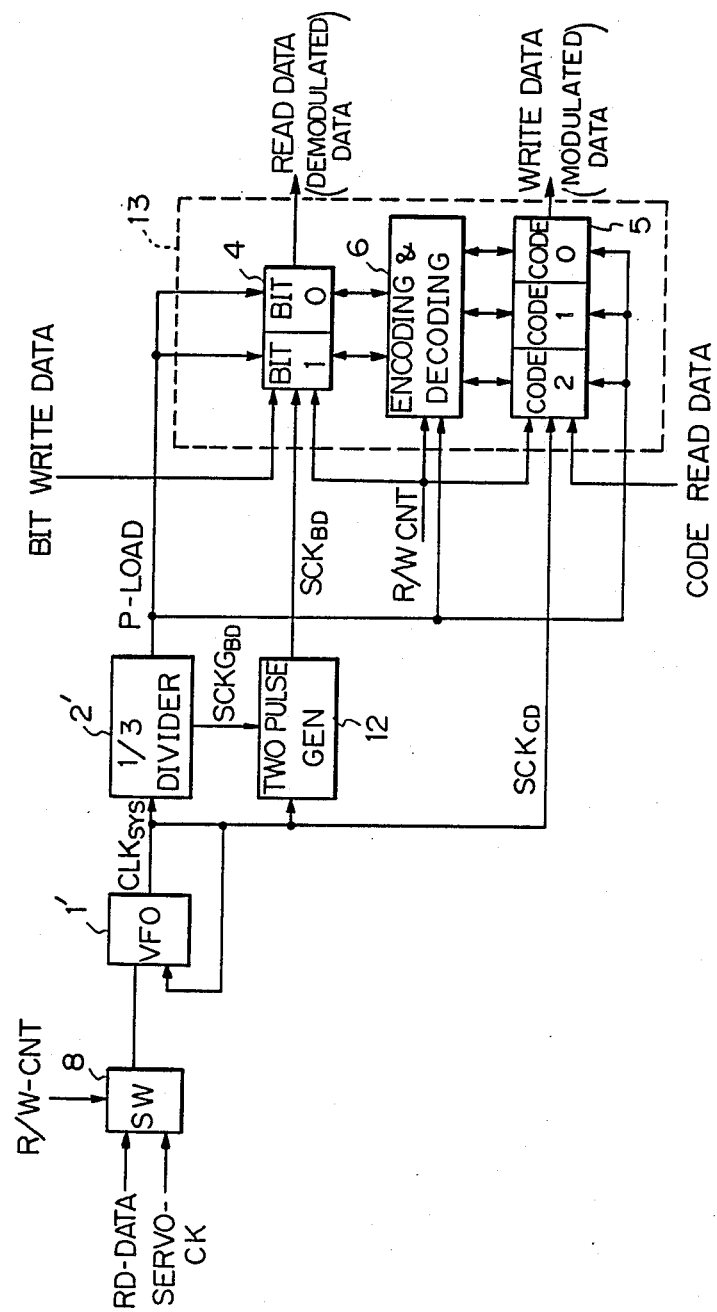
FIG. 9 is a circuit diagram of a second embodiment of a data modulation and demodulation system in accordance with the present invention.

Referring to FIG. 9, a second embodiment of a data modulation and demodulation system, in which the above defect of the first embodiment is eliminated, will be described. In FIG. 9, the data modulation and demodulation system includes the switch 8, a VFO 1', a ⅓ frequency divider 2', a two pulse generator 12, and the encoding and decoding unit 13 consisting of the bit register 4, the encoding and decoding circuit 6, and the code register 5. The switch 8 and the encoding and decoding unit 13 are substantially the same as those shown in FIG. 1. The circuit construction of the VFO 1', per se, is similar to that shown in FIG. 2, except that the VFO 1' operates at a lower frequency than that of the VFO 1 shown in FIG. 1. The ⅓ frequency divider 2' can be realized by the circuit shown in FIG. 3. In this embodiment, a Q output of the J-K FF 22 of the ⅓ frequency divider is called a bit data shift gate clock $SCKG_{BD}$, and a $\bar{Q}$ output of the J-K FF 21 provides the parallel load signal P-LOAD as shown in FIG. 3 and FIG. 4C.

The two pulse generator 12 is provided instead of the ⅓ frequency divider 3 shown in FIG. 1. The two pulse generator 12 generates two train pulses used for the bit data shift clock $SCK_{BD}$ on the basis of the bit data shift gate clock $SCKG_{BD}$ from the ⅓ frequency divider 2' and the system clock $CLK_{SYS}$ from the VFO 1'.

A first circuit example of the two pulse generator 12 is shown in FIG. 10. In FIG. 10, the two pulse generator 12 is an OR gate 121. The timing of the generation of the bit data shift clock $SCK_{BD}$ is shown in FIGS. 11a to 11c. The bit data shift clock $SCK_{BD}$ has a frequency which is two-thirds that of the frequency of the system clock $CLK_{SYS}$. Particular note should be taken of this frequency relationship. Accordingly, the system clock $CLK_{SYS}$ also can be used for the code data shift clock $SCK_{CD}$ supplied to the code register 5. The bit data shift clock $SCK_{BD}$ from the two pulse generator 12 is supplied to the bit register 4. Under the same conditions as those of the first embodiment, when the frequency of the bit data shift clock $SCK_{BD}$ is 36 MHz, the frequency of the code data shift clock $SCK_{CD}$ and the system clock $CLK_{SYS}$ is 54 MHz. Therefore, the VFO 1' is operable at a frequency of 54 MHz, which is a half of that of the VFO 1 shown in FIG. 1.

The bit data shift clock $SCK_{BD}$ shown in FIG. 11C is not evenly distributed, but is synchronized with the code data shift clock $SCK_{CD}$ and the system clock $CLS_{SYS}$ at the start of every bit data shift clock $SCK_{BD}$ as marked by small circles in FIGS. 11a to 11c. This satisfies the requirement of the synchronization therebetween.

The data write operation of the second embodiment of the data modulation and demodulation system, in which the circuit shown in FIG. 10 is applied thereto, will be described with reference to FIGS. 12a to 12j. FIGS. 12a to 12c correspond to FIGS. 11a to 11c, FIGS. 12f and 12g show the two bit data BIT1 and BIT0 of the bit register 4, and FIGS. 12h to 12j show the three bit data CODE2 to CODE0 of the code register 5.

The VFO 1' receives the servo clock SERVO-CK from the switch 8 and generates the system clock $CLK_{SYS}$ and the code data shift clock $SCK_{CD}$ of 54 MHz (FIG. 12a). The ⅓ frequency divider 2' outputs the parallel load signal P-LOAD (FIG. 12d), and the two pulse generator 12 outputs the bit data shift clock $SCK_{BD}$ of 36 MHz (FIG. 12c) to the bit register 4. The BIT WRITE DATA supplied to the bit register 4 is shifted by the bit data shift clock SCK$_{BD}$ and stored in the D-FF's 45 and 49 shown in FIG. 6 (FIGS. 12e to 12g). The data BIT1 and BIT0 is loaded into the encoding and decoding circuit 6 in response to the parallel load signal P-LOAD, and the encoding and decoding circuit 6 carries out the two bits to three bits encoding in response to the read and write control signal which indicates a data write, and outputs the encoded data to the code register 5. The encoded data is stored in the code register 5 in response to the next parallel load signal P-LOAD and stored in the D-FF's 56, 60, and 64 shown in FIG. 6 by the code data shift clock SCK$_{CD}$. The stored data CODE2 to CODE0 is output as code write (modulated) data.

FIGS. 13a to 13j are timing charts representing the data read operation.

A second circuit example of the two pulse generator 12 is shown in FIG. 14. The two pulse generator in FIG. 14 includes an AND gate 125, a delay circuit 126, and an OR gate 127. FIGS. 15a to 15c are timing representing the bit data shift clock SCK$_{BD}$. The delay circuit 126 delays an output signal from the AND gate 126 by a time ΔT between times ΔT$_1$ and ΔT$_2$. Compared with the bit data shift clock SCK$_{BD}$ of the OR gate 121 shown in FIG. 10, the bit data shift clock SCK$_{BD}$ of FIG. 14 is evenly distributed.

FIGS. 16a to 16j are timing charts representing the data write operation of the second embodiment of the data modulation and demodulation system in which the circuit shown in FIG. 14 is applied thereto. The operational principle of the data write is similar to that described above with reference to FIGS. 12a to 12j.

FIGS. 17a to 17j are timing charts illustrating the data read operation and correspond to FIGS. 13a to 13j.

Many widely different embodiments of the present invention may be constructed without departing from the spirit and scope of the present invention. It should be understood that the present invention is not limited to the specific embodiments described in this specification, except as defined in the appended claims.

What is claimed is:

1. A system for modulating and demodulating data written into and read from a magnetic recording medium in accordance with a (1,7) run length limited method, the magnetic medium providing a reference signal, said system comprising:
    a first clock pulse generating circuit, operatively connected to receive the reference signal from the recording medium, for generating a first clock pulse having a first frequency equal to a data write frequency in accordance with a phase of the reference signal;
    a second clock pulse generating circuit, operatively connected to receive the first clock pulse, for generating a second clock pulse having a second frequency, the second clock pulse being obtained by masking one pulse of every three successive occurrences of the first clock pulse, the second frequency accordingly being two-thirds of the first frequency; and
    an encoding and decoding unit, operatively connected to said first and second clock pulse generating circuits, for encoding write data to be written in accordance with (1,7) encoding and for decoding read data read in accordance with (1,7) decoding, in response to the first and second clock pulses.

2. A system according to claim 1, wherein said first clock pulse generating circuit comprises a phase-locked loop circuit, operatively connected to receive the reference signal and to said encoding and decoding unit and said second clock pulse generating circuit.

3. A system according to claim 1, wherein said second clock pulse generating circuit comprises:
    a one-third frequency divider, operatively connected to said first clock pulse generating circuit to receive the first clock pulse, for producing a gate pulse having a frequency one-third that of the first frequency of the first clock pulse; and
    an OR gate, operatively connected to said first clock pulse generating circuit to receive the first clock pulse and to said one-third frequency divider to receive the gate pulse, for outputting the second clock pulse.

4. A system according to claim 3, wherein said one-third frequency divider comprises first and second flip-flops, having clock terminals operatively connected to said first clock pulse generating circuit to receive the first clock pulse, a first J terminal of said first flip-flop operatively connected to a positive output terminal of said second flip-flop, and a second J terminal of said second flip-flop operatively connected to a negative output terminal of said first flip-flop, the positive output terminal of said second flip-flop being operatively connected to said encoding and decoding unit and said OR gate to supply the first clock pulse.

5. A system according to claim 1, wherein said second clock pulse generating circuit comprises:
    a one-third frequency divider, operatively connected to said first clock pulse generating circuit to receive the first clock pulse, for producing a gate pulse having a frequency one-third that of the first frequency of the first clock pulse;
    an AND gate, operatively connected to said first clock pulse generating circuit to receive the first clock pulse and to said one-third frequency divider to receive the gate pulse, for producing an output signal;
    a delay circuit, operatively connected to said AND gate, for delaying the output signal from said AND gate by between one cycle and one and one-half cycle of the first clock pulse to produce a delayed signal; and
    an OR gate operatively connected to receive the output signal from said AND gate, to receive the delayed signal from said delay circuit and to supply the second clock pulse to said encoding and decoding unit.

6. A system according to claim 5, wherein said one-third frequency divider comprises first and second flip-flops, having clock terminals operatively connected to said first clock pulse generating circuit to receive the first clock pulse, a first J terminal of said first flip-flop operatively connected to a negative output terminal of said first flip-flop, the positive output terminal of said second flip-flop being operatively connected to said encoding and decoding unit and said AND gate to supply the first clock pulse.

7. A system according to claim 1, wherein said encoding and decoding unit comprises:
    a first shift register, having two bits, operatively connected to said second clock pulse generating circuit to receive the second clock pulse and to receive the write data;
    a second shift register, having three bits, operatively connected to said first clock pulse generating circuit to receive the first clock pulse and to receive the read data; and an encoding and decoding circuit, operatively connected to said first and second shift registers, for receiving the write data from said first shift register, for encoding the write data in accordance with the (1,7) coding to produce encoded data and for outputting the encoded data to said second shift register, when a data write operation is carried out, and for receiving the read data from said second shift register, for decoding the read data in accordance with the (1,7) decoding to produce decoded data and for outputting the decoded data to said first shift register, when a data read operation is carried out.

8. A system for modulating and demodulating data written into and from a magnetic recording medium, comprising:

reference signal means for providing a reference signal having a reference frequency;

one-third divider means for dividing the reference signal by one-third to produce a first clock pulse signal having a first frequency equal to one-third of the reference frequency;

one-half divider means for dividing the reference signal by one-half to produce a second clock pulse signal having a second frequency equal to one-half the reference frequency; and encoding/decoding means for encoding write data to be written onto the magnetic recording medium and for decoding read data read from the magnetic recording medium, using the first and second clock pulse signals.

9. A system for modulating and demodulating data written into and read from a magnetic recording medium in accordance with a (1,7) run length limited method, the magnetic medium providing a reference signal, said system comprising:

a first clock pulse generating circuit, operatively connected to receive the reference signal from the recording medium, for generating first clock pulses having a first frequency equal to a data write frequency in accordance with a phase of the reference signal;

a second clock pulse generating circuit, operatively connected to receive the first clock pulses, for generating second clock pulses having a second frequency, the second frequency being two-thirds of the first frequency, said second clock pulse generating circuit including a one-third frequency divider, operatively connected to said first clock pulse generating circuit to receive the first clock pulses, for producing gate pulses having a third frequency equal to one-third of the first frequency; and an OR gate, operatively connected to said first clock pulse generating circuit to receive the first clock pulses and to said one-third frequency divider to receive the gate pulses for outputting the second clock pulses; and an encoding and decoding unit, operatively connected to said first clock pulse generating circuit and said OR gate, for encoding write data to be written in accordance with (1,7) encoding and for decoding read data read in accordance with (1,7) decoding, in response to the first and second clock pulses.

10. A system according to claim 9, wherein said one-third frequency divider comprises first and second flip-flops, each having J, clock and positive and negative output terminals, the clock terminals operatively connected to said first clock pulse generating circuit to receive the first clock pules, the J terminal of said first flip-flop operatively connected to the positive output terminal of said second flip-flop, the negative output terminal of said first flip-flop operatively connected to the J terminal of said second flip-flop and to said encoding and decoding unit, and the positive output terminal of said second flip-flop operatively connected to said OR gate to supply the gate pulses.

11. A system for modulating and demodulating data written into and read from a magnetic recording medium in accordance with a (1,7) run length limited method, the magnetic medium providing a reference signal, said system comprising:

a first clock pulse generating circuit, operatively connected to receive the reference signal from the recording medium, for generating first clock pulses having a first frequency equal to a data write frequency in accordance with a phase of the reference signal;

a second clock pulse generating circuit, operatively connected to receive the first clock pulses, for generating second clock pulses having a second frequency, the second frequency being two-thirds of the first frequency, said second clock pulse generating circuit including a one-third frequency divider, operatively connected to said first clock pulse generating circuit to receive the first clock pulses, for producing gate pulses having a frequency one-third that of the first frequency of the first clock pulses;

an AND gate, operatively connected to said first clock pulse generating circuit to receive the first clock pulses and to said one-third frequency divider to receive the gate pulses, for producing an output signal;

a delay circuit, operatively connected to said AND gate, for delaying the output signal from said AND gate by between one cycle and one and one-half cycle of the first clock pulses to produce a delayed signal; and an OR gate operatively connected to receive the output signal from said AND gate and the delayed signal from said delay circuit and to output the second clock pulses; and an encoding and decoding unit, operatively connected to said first clock pulse generating circuit and said OR gate, for encoding write data to be written in accordance with (1,7) encoding and for decoding read data read in accordance with (1,7) decoding, in response to the first and second clock pulses.

12. A system according to claim 11, wherein said one-third frequency divider comprises first and second flip-flops, each having J, clock and positive and negative output terminals, the clock terminals operatively connected to said first clock pulse generating circuit to receive the first clock pulses, the J terminal of said first flip-flop operatively connected to the positive output terminal of said second flip-flop, the negative output terminal of said first flip-flop, operatively connected to the J terminal of said second flip-flop and to said encoding and decoding unit, and the positive output terminal of said second flip-flop operatively connected to said AND gate to supply the gate pulses.

13. A system for modulating and demodulating data written into and read from a magnetic recording medium in accordance with a (1,7) run length limited method, the magnetic medium providing a reference signal, said system comprising:
- a first clock pulse generating circuit, operatively connected to receive the reference signal from the recording medium, for generating first clock pulses having a first frequency equal to a data write frequency in accordance with a phase of the reference signal;
- a second clock pulse generating circuit, operatively connected to receive the first clock pulses, for generating second clock pulses having a second frequency, the second frequency being two-thirds of the first frequency; and
- an encoding and decoding unit, operatively connected to said first and second clock pulses generating circuits, for encoding write data to be written in accordance with (1,7) encoding and for decoding read data read in accordance with (1,7) decoding, in response to the first and second clock pulses; said encoding and decoding unit including
- a first shift register, having two bits, operatively connected to said second clock pulse generating circuit to receive the second clock pulses and to receive the write data;
- a second shift register, having three bits, operatively connected to said first clock pulse generating circuit to receive the first clock pulses and to receive the read data; and
- an encoding and decoding circuit, operatively connected to said first and second shift registers, for receiving the write data from said first shift register for encoding the write data in accordance with the (1,7) coding to produce encoded data and for outputting the encoded data to said second shift register, when a data write operation is carried out, and for receiving the read data from said second shift register, for decoding the read data in accordance with the (1,7) decoding to produce decoded data and for outputting the decoded data to said first shift register, when a data read operation is carried out.

* * * * *